US012610599B2

(12) United States Patent
Tsuchiya et al.

(10) Patent No.: US 12,610,599 B2
(45) Date of Patent: Apr. 21, 2026

(54) NITRIDE SEMICONDUCTOR WAFER AND METHOD FOR PRODUCING NITRIDE SEMICONDUCTOR WAFER

(71) Applicant: SHIN-ETSU HANDOTAI CO., LTD., Tokyo (JP)

(72) Inventors: Keitaro Tsuchiya, Takasaki (JP); Masaru Shinomiya, Annaka (JP); Kosei Sugawara, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 545 days.

(21) Appl. No.: 18/013,618

(22) PCT Filed: Jul. 12, 2021

(86) PCT No.: PCT/JP2021/026066
§ 371 (c)(1),
(2) Date: Dec. 29, 2022

(87) PCT Pub. No.: WO2022/024729
PCT Pub. Date: Feb. 3, 2022

(65) Prior Publication Data
US 2023/0290835 A1 Sep. 14, 2023

(30) Foreign Application Priority Data
Jul. 29, 2020 (JP) ................................. 2020-128377

(51) Int. Cl.
*H10D 62/85* (2025.01)
*H01L 21/02* (2006.01)
*H10D 62/40* (2025.01)

(52) U.S. Cl.
CPC ... *H10D 62/8503* (2025.01); *H01L 21/02381* (2013.01); *H01L 21/02433* (2013.01); *H01L 21/02458* (2013.01); *H10D 62/40* (2025.01)

(58) Field of Classification Search
CPC ................ H10D 62/8503; H10D 62/40; H01L 21/02381; H01L 21/02433;
(Continued)

(56) References Cited

U.S. PATENT DOCUMENTS

| | | | |
|---|---|---|---|
| 6,548,886 B1* | 4/2003 | Ikari | C30B 29/06 257/E21.321 |
| 2010/0224968 A1 | 9/2010 | Kurita | |
| 2019/0198623 A1* | 6/2019 | Yue | H10D 62/357 |

FOREIGN PATENT DOCUMENTS

| | | |
|---|---|---|
| JP | 2011-103380 A | 5/2011 |
| JP | 2012-079952 A | 4/2012 |

(Continued)

OTHER PUBLICATIONS

Aug. 8, 2024 Extended Search Report issued in European Patent Application No. 21850368.8.
(Continued)

*Primary Examiner* — Julia Slutsker
(74) *Attorney, Agent, or Firm* — Oliff PLC

(57) ABSTRACT

The present invention is a nitride semiconductor wafer, including: a silicon single-crystal substrate; and a device layer composed of a nitride semiconductor above the silicon single-crystal substrate, wherein the silicon single-crystal substrate is a CZ silicon single-crystal substrate, and has a resistivity of 1000 $\Omega \cdot$cm or more, an oxygen concentration of $5.0 \times 10^{16}$ atoms/cm$^3$ (JEIDA) or more and $2.0 \times 1.0^{17}$ atoms/cm$^3$ (JEIDA) or less, and a nitrogen concentration of $5.0 \times 10^{14}$ atoms/cm$^3$ or more. This provides a nitride semiconductor wafer that hardly causes plastic deformation even using a high-resistant low-oxygen silicon single-crystal substrate produced by the CZ method, which is suitably used for a high-frequency device, and that can reduce warpage of the substrate.

4 Claims, 2 Drawing Sheets

(58) Field of Classification Search

CPC ......... H01L 21/02458; H01L 21/02002; H01L 21/0254; C30B 29/403; C30B 25/18; C30B 29/06

See application file for complete search history.

(56) References Cited

FOREIGN PATENT DOCUMENTS

| | | | |
|---|---|---|---|
| JP | 2014-94851 | A | 5/2014 |
| JP | 2020-98839 | A | 6/2020 |
| KR | 10-2006-0054729 | A | 5/2006 |
| TW | 202027139 | A | 7/2020 |
| WO | 2020/129540 | A1 | 6/2020 |

OTHER PUBLICATIONS

Graupner, Robert Kurt, "A Study of Oxygen Precipitation in Heavily Doped Silicon", Portland State University, pp. 1-132, 1989.

Sep. 14, 2021 International Search Report issued in International Patent Application No. PCT/JP2021/026066.

Jan. 31, 2023 International Preliminary Report on Patentability issued in International Patent Application No. PCT/JP2021/026066.

Dec. 15, 2020 Office Action issued in Japanese Patent Application No. 2020-128377.

Jan. 23, 2025 Office Action issued in Taiwanese Patent Application No. 110126343.

* cited by examiner

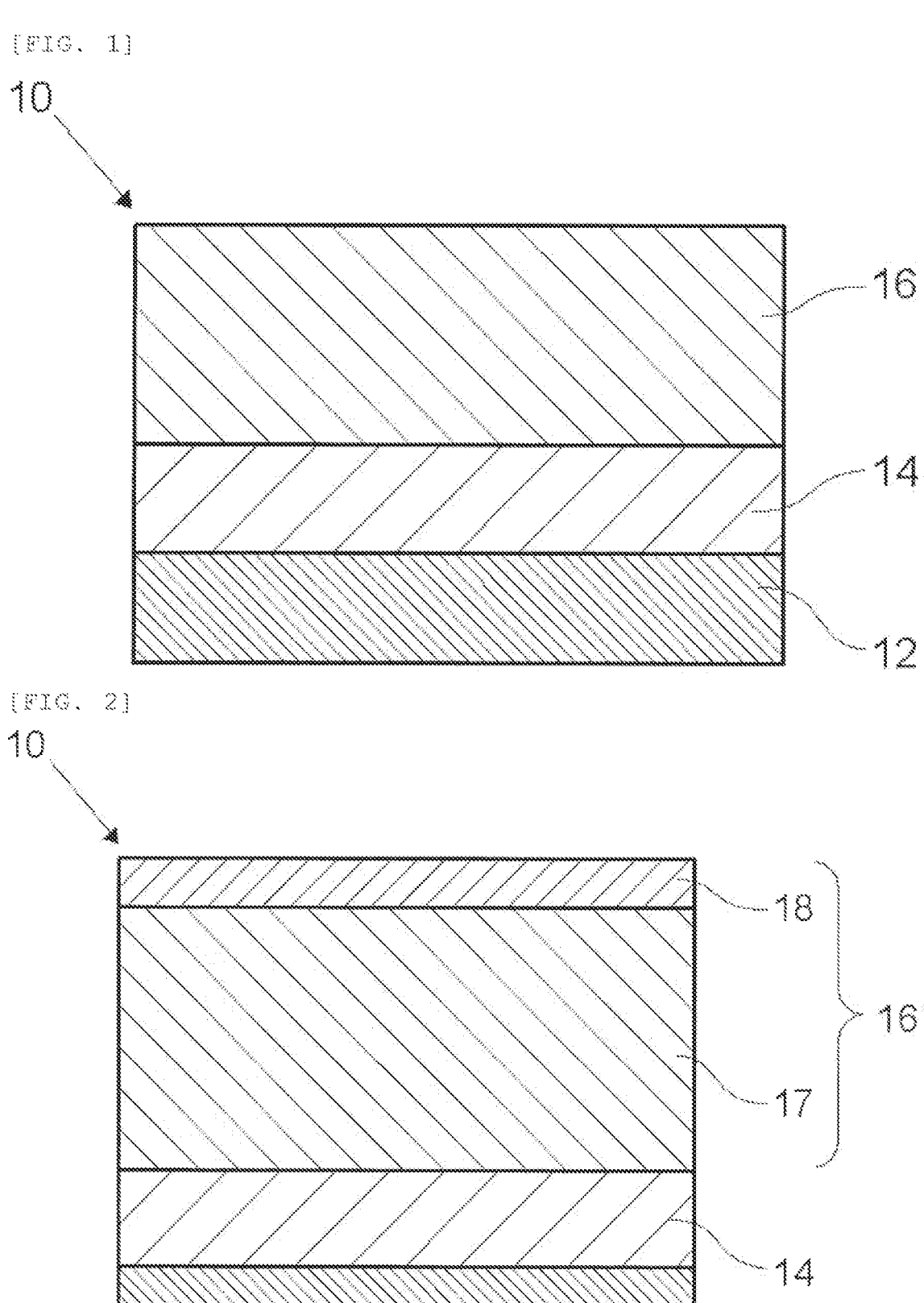
[FIG. 1]
[FIG. 2]

[FIG. 3]
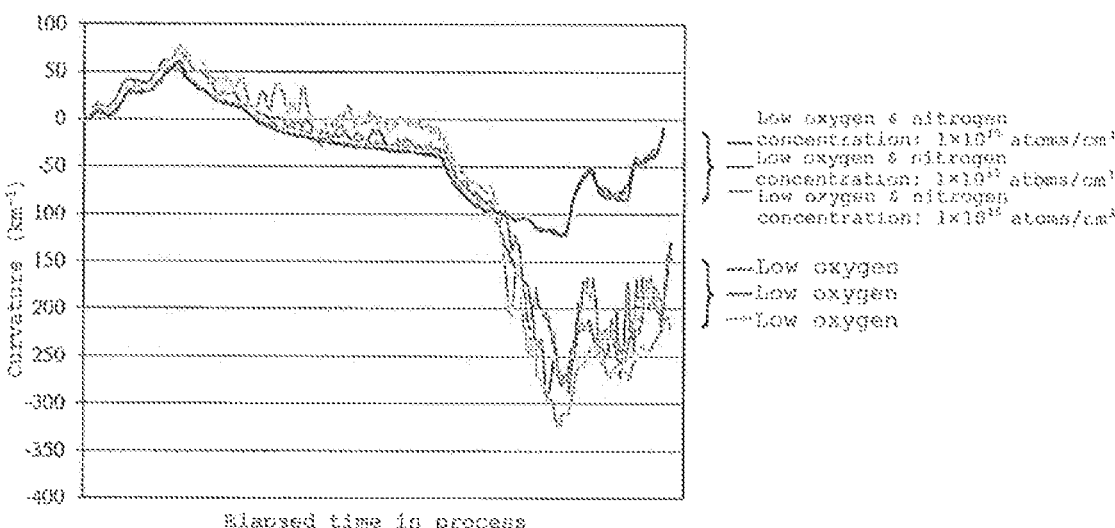

NITRIDE SEMICONDUCTOR WAFER AND METHOD FOR PRODUCING NITRIDE SEMICONDUCTOR WAFER

TECHNICAL FIELD

The present invention relates to a nitride semiconductor wafer and a method for producing a nitride semiconductor wafer.

BACKGROUND ART

In high-frequency devices, development to integrate devices such as an antenna, an amplifier, a switch, and a filter is advanced for miniaturization and cost reduction. As higher frequency is used, a circuit becomes more complex, and used materials for the device are various materials including a silicon CMOS (Complementary MOS), a device using a III-V group semiconductor or a nitride semiconductor, and a filter using a piezoelectric material.

For a substrate to be a base of these devices, a silicon substrate whose large-diameter wafers are inexpensively distributed is considered to be suitable.

CITATION LIST

Patent Literature

Patent Document 1: JP 2011-103380 A
Patent Document 2: JP 2020-98839 A
Patent Document 3: JP 2012-79952 A

SUMMARY OF INVENTION

Technical Problem

Patent Document 1 discloses growth of a compound semiconductor on a silicon substrate having an oxygen concentration of $0.2 \times 10^{11}$ atoms/cm$^3$ or more.

However, in particular for a substrate for a high-frequency device, a substrate having a low oxygen concentration, which has high resistance and little change in resistivity due to a thermal donor, is considered to be suitable. In addition, the high-frequency device requires to reduce a parasitic capacity of the device, support substrate thereof, and peripheral package in order to improve the high-frequency characteristics. Use of a high-resistant low-oxygen silicon substrate, which hardly generates a thermal donor for the support substrates or the packages, to reduce the parasitic capacity is considered to improve the characteristics and to have a cost merit. As described above, a substrate having a lower oxygen concentration has an advantage in terms of electric characteristics. Such a substrate, however, has a problem of being likely to cause plastic deformation due to the lower oxygen concentration.

Production of a device includes steps of epitaxial growth on a substrate, a heat treatment, laminating, etc., and during the steps, a stress is generated on the substrate due to difference in a lattice constant or difference in a thermal expansion coefficient between the different materials. Unfortunately, the high-resistant low-oxygen silicon substrate, which has a lower Young's modulus when dislocated than a common low-resistance Czochralski (CZ) silicon substrate produced by the CZ method, has a demerit of being likely to cause plastic deformation. If the plastic deformation occurs, the wafer is largely deformed and fail to return the shape to the original shape, and thereby abnormal warpage or bonding defect may occur.

Patent Document 2 describes art to grow a nitride semiconductor on a substrate having a high nitrogen concentration and produced by Floating Zone (FZ) method. The FZ method, however, is difficult to obtain a crystal having a high nitrogen concentration in balk, and has a problem of a low yield. In addition, the FZ substrate is difficult to obtain a <111> substrate having a diameter of 200 nm or more, and has a limit of enlarging the diameter.

Accordingly, the present inventors have focused on the CZ method, which can produce wafers having a large diameter, to earnestly make investigation, and consequently found that a high-resistance CZ silicon substrate with a low-oxygen concentration has deteriorated mechanical properties compared with a low-resistance CZ silicon substrate, leading to a problem of being likely to cause plastic deformation due to dislocation growth. In particular, growth of GaN on a silicon substrate is likely to increase warpage or cause plastic deformation due to a stress derived from difference in a lattice constant or difference in a thermal expansion coefficient. Thus, the stress is reduced with growth condition or a relaxation layer.

In Patent Document 3, for example, using an intermediate layer of a gallium nitride-based compound semiconductor periodically stacked a plurality of times for relaxing the stress to produce a wafer having little warpage and cracking. However, it is concerned that producing such a complex intermediate layer extends the growth time to decrease flexibility of design.

The present invention is made to solve the above problem. An object of the present invention is to provide a nitride semiconductor wafer that hardly causes plastic deformation even using a high-resistant low-oxygen silicon single-crystal substrate produced by the CZ method, which is suitably used for a high-frequency device, and that can reduce substrate warpage. An object of the present invention is also to provide a producing method thereof.

Solution to Problem

The present invention is made to achieve the above object. The present invention provides a nitride semiconductor wafer, comprising: a silicon single-crystal substrate; and a device layer composed of a nitride semiconductor above the silicon single-crystal substrate, wherein the silicon single-crystal substrate is a CZ silicon single-crystal substrate, and has a resistivity of 1000 Ω·cm or more, an oxygen concentration of $5.0 \times 10^6$ atoms/cm$^3$ (JEIDA) or more and $2.0 \times 10^7$ atoms/cm$^3$ (JEIDA) or less, and a nitrogen concentration of $5.0 \times 10^4$ atoms/cm$^3$ or more.

Such a nitride semiconductor wafer is a nitride semiconductor wafer with inhibited plastic deformation even using a high-resistant low-oxygen CZ silicon single-crystal substrate, which is suitable for a high-frequency device, and with reduced substrate warpage. In addition, such a nitride semiconductor wafer can be a nitride semiconductor wafer using a silicon single-crystal substrate having a larger diameter or many plane orientations.

In this time, the nitride semiconductor wafer preferably further comprises an intermediate layer composed of a nitride semiconductor or a metal above the silicon single-crystal substrate, wherein the nitride semiconductor wafer has the device layer composed of the nitride semiconductor above the intermediate layer.

Such an intermediate layer functions as a cushioning layer for improving crystallinity or regulating a stress of the device layer composed of the nitride semiconductor thin film present above the intermediate layer. Thus, such an intermediate layer yields the nitride semiconductor wafer with further inhibited plastic deformation and further reduced substrate warpage.

The present invention also provides a method for producing a nitride semiconductor wafer, the method comprising a step of epitaxially growing a nitride semiconductor thin film above a silicon single-crystal substrate, wherein used as the silicon single-crystal substrate is a silicon single-crystal substrate produced by a CZ method, having a resistivity of 1000 Ω·cm or more, having an oxygen concentration of $5.0\times10^{16}$ atoms/cm$^3$ (JEIDA) or more and $2.0\times10^{17}$ atoms/cm$^3$ (JEIDA) or less, and having a nitrogen concentration of $5.0\times10^4$ atoms/cm$^3$ or more.

According to such a method for producing a nitride semiconductor wafer, plastic deformation is inhibited even using a high-resistant low-oxygen CZ silicon single-crystal substrate, which is suitable for a high-frequency device, and the nitride semiconductor wafer with reduced substrate warpage can be easily produced.

In this time, an intermediate layer composed of a nitride semiconductor or a metal is preferably formed above the silicon single-crystal substrate, and the nitride semiconductor thin film is preferably grown above the intermediate layer.

Such an intermediate layer functions as a cushioning layer for improving crystallinity or regulating a stress of the device layer composed of the nitride semiconductor thin film formed above the intermediate layer. Thus, the nitride semiconductor wafer with further inhibited plastic deformation and reduced substrate warpage can be further easily produced.

Advantageous Effects of Invention

As described above, the inventive nitride semiconductor wafer and the producing method thereof can inhibit plastic deformation even using a high-resistant low-oxygen CZ silicon single-crystal substrate, which is suitable for a high-frequency device, and can reduce substrate warpage.

BRIEF DESCRIPTION OF DRAWINGS

FIG. 1 is a schematic sectional view schematically illustrating an example of the inventive nitride semiconductor wafer.

FIG. 2 is a schematic sectional view illustrating a case of forming a HEMT structure as an application example of the inventive nitride semiconductor wafer.

FIG. 3 is a graph indicating a change in a curvature of a nitride semiconductor wafer during vapor-phase growth.

DESCRIPTION OF EMBODIMENTS

As described above, required are a nitride semiconductor wafer and a producing method thereof that hardly cause plastic deformation even using a high-resistant CZ silicon single-crystal substrate, which is suitable for a high-frequency device, and that can reduce substrate warpage.

The present inventors have earnestly studied the above problem, and consequently found that a nitride semiconductor wafer, comprising: a silicon single-crystal substrate; and a device layer composed of a nitride semiconductor above the silicon single-crystal substrate, wherein the silicon single-crystal substrate is a CZ silicon single-crystal substrate, and has a resistivity of 1000 Ω·cm or more, an oxygen concentration of $5.0\times10^{11}$ atoms/cm$^3$ (JEIDA) or more and $2.0\times10^{17}$ atoms/cm$^3$ (JEIDA) or less, and a nitrogen concentration of $5.0\times10^{14}$ atoms/cm$^3$ or more can provide a nitride semiconductor wafer with inhibited plastic deformation even using a high-resistant low-oxygen CZ silicon single-crystal substrate, which is suitable for a high-frequency device, and with reduced substrate warpage. This finding has led to the completion of the present invention.

The present inventors have also found that a method for producing a nitride semiconductor wafer, the method comprising a step of epitaxially growing a nitride semiconductor thin film above a silicon single-crystal substrate, wherein used as the silicon single-crystal substrate is a silicon single-crystal substrate produced by a CZ method, having a resistivity of 1000 Ω·cm or more, having an oxygen concentration of $5.0\times10^{16}$ atoms/cm$^3$ (JEIDA) or more and $2.0\times10^{17}$ atoms/cm$^3$ (JEIDA) or less, and having a nitrogen concentration of $5.0\times10^{14}$ atoms/cm$^3$ or more can provide a producing method that can easily produce a nitride semiconductor wafer with inhibited plastic deformation even using a high-resistant low-oxygen CZ silicon single-crystal substrate, which is suitable for a high-frequency device, and with reduced substrate warpage. This finding has led to the completion of the present invention.

Hereinafter, the present invention will be described in detail with reference to the drawings as an example of an embodiment, but the present invention is not limited thereto. FIG. 1 illustrates a schematic view of an example of the inventive nitride semiconductor wafer.

A nitride semiconductor wafer 10 according to the present invention illustrated in FIG. 1 has a device layer 16 composed of a nitride semiconductor thin film above a silicon single-crystal substrate 12. Used as the silicon single-crystal substrate 12 is a silicon single-crystal substrate produced by the CE method, and having a resistivity of 1000 Ω·cm or more, an oxygen concentration of $5.0\times10^{17}$ atoms/cm$^3$ (JEIDA) or more and $2.0\times10^{17}$ atoms/cm$^3$ (JEIDA) or less, and an added (doped) nitrogen at $5.0\times10^{14}$ atoms/cm$^3$ or more.

The resistivity is 1000 Ω·cm or more, which is required for a substrate for a high-frequency device. Since a higher resistivity is more preferable, the upper limit is not particularly limited. The resistivity can be, for example, 10 kΩ·cm or less. The oxygen concentration has an upper limit of $2.0\times10^{17}$ atoms/cm$^3$ (JEIDA) because a thermal donor non-negligibly affects the resistivity if the oxygen concentration exceeds $2.0\times10^{17}$ atoms/cm$^3$ (JEIDA). Since a single crystal having an oxygen concentration of less than $5.0\times10^{16}$ atoms/cm$^3$ (JEIDA) is extremely difficult to be produced by the CZ method, the lower limit of the oxygen concentration is $5.0\times10^{14}$ atoms/cm$^3$ (JEIDA)).

Unfortunately, reducing the oxygen concentration of the high-resistance substrate as above has a problem of decrease in Young's modulus when dislocated compared with a common low-resistance CZ silicon wafer and is likely to cause plastic deformation. Accordingly, the present inventors have found that using a silicon substrate into which nitrogen is added at $5.0\times10^{14}$ atoms/cm$^3$ or more as a high-resistant low-oxygen CZ silicon single-crystal substrate can inhibit the plastic deformation.

Inhibiting the plastic deformation can reduce abnormal warpage to improve the production yield of the nitride semiconductor wafer 10. Since the silicon single-crystal substrate 12 can withstand a stress, the nitride semiconductor thin film to be the device layer 16 with vapor-phase growth can be thick, resulting in improvement in flexibility of design of the device. In addition, further increasing the nitrogen concentration in the silicon single-crystal substrate 12 to $1.0 \times 10^{15}$ atoms/cm$^3$ or more, particularly $5.0 \times 10^{15}$ atoms/cm$^3$ or more, can further reduce the substrate warpage, and can further certainly prevent the plastic deformation. The concentration of nitrogen contained in the silicon single-crystal substrate 12 is preferably $5.0 \times 10^6$ atoms/cm$^3$ or less. This is because the nitrogen concentration of $5.0 \times 10^{16}$ atoms/cm$^3$ or less can prevent decrease in single-crystallization rate of the silicon single crystal, which is a raw material of the silicon single-crystal substrate 12.

In this time, the high-resistant low-oxygen CZ silicon single-crystal substrate preferably has a diameter of 200 mm or more because such a substrate with a large diameter can take the advantage of the CZ method. A plane orientation of the major surface of the substrate is not particularly limited, and can be (100), (110), (111), etc. In particular, a substrate having a diameter of 200 mm or more and a plane orientation of (111) is beneficial because such a substrate is difficult to be produced by the FZ method.

Such a nitride semiconductor wafer hardly causes the plastic deformation and with reduced warpage even using a high-resistant low-oxygen CZ silicon single-crystal substrate, which is suitable for a high-frequency device.

As illustrated in FIG. 1, the nitride semiconductor wafer may have an intermediate layer 14 between the silicon single-crystal substrate 12 and the device layer 16. The intermediate layer 14 is composed of a nitride semiconductor or a metal. The intermediate layer 14 serves as an inserted cushioning layer for improving the crystallinity of the device layer 16 and regulating the stress. When such improvements in stress and crystallinity are unnecessary, the intermediate layer 14 can be eliminated. With considering a structure of the device, such as a high-frequency filter, the intermediate layer 14 may be produced from a metal usable for a sacrificial layer forming a space or for an electrode. The intermediate layer 14 may be an intermediate layer composed of a metal, or may be an intermediate layer composed of a nitride semiconductor. When the intermediate layer 14 is composed of a nitride semiconductor, its composition may be different from or same as a composition of the nitride semiconductor thin film to be the device layer 16. When the intermediate layer 14 is composed of a nitride semiconductor, it can be mentioned that the intermediate layer 14 and the device layer 16 constitute the nitride semiconductor thin film. The intermediate layer 14 may have the composition changed during the growth.

On a surface of the silicon single-crystal substrate 12 (boundary with the intermediate layer 14 in FIG. 1), a trap-rich layer that shortens a life of the carrier may be formed.

As an application example of the inventive nitride semiconductor wafer, FIG. 2 illustrates a case of forming a high electron-mobility transistor (HEMT) structure. In the high electron-mobility transistor (HEMT) structure as illustrated in FIG. 2, the device layer 16 is constituted with a gallium nitride (GaN) layer 17 and an electron supply layer 18 composed of AlGaN formed thereon, for example.

Gallium nitride has a difference in a lattice constant of 17% and a difference in a thermal expansion coefficient of 116% with the Si (111) single crystal. Thus, a stress is applied to the thin film and the substrate during the growth at high temperature. In addition, since the gallium nitride with growing is heated at 1000° C. or higher, a stress applied to the wafer does not cause brittle fracture but exhibits ductility, which generates dislocation to cause the plastic deformation.

Accordingly, in the present invention, the silicon substrate into which nitrogen is added at $5.0 \times 10^{14}$ atoms/cm$^3$ or more is used as the silicon single-crystal substrate 12 to prevent progress of the dislocation of the silicon single-crystal substrate 12, which can prevent the plastic deformation. Preventing the plastic deformation can reduce abnormal warpage to improve the production yield of the nitride semiconductor wafer 10. Since the silicon single-crystal substrate 12 can withstand a stress, the nitride semiconductor thin film to be the device layer 16 with vapor-phase growth can be thick, resulting in improvement in flexibility of design of the device.

Next, the inventive method for producing a nitride semiconductor wafer will be described. The description will be made with reference to FIG. 1. In the inventive method for producing a nitride semiconductor wafer, the silicon single-crystal substrate 12 is first prepared, and then the nitride semiconductor thin film to be the device layer 16 is epitaxially grown above the silicon single-crystal substrate 12. In the present invention, used as the silicon single-crystal substrate 12 is a silicon single-crystal substrate produced by a CZ method, having an oxygen concentration of $5.0 \times 10^{16}$ atoms/cm$^3$ (JEIDA) or more and $2.0 \times 10^{17}$ atoms/cm$^3$ (JEIDA) or less, having a nitrogen concentration of $5.0 \times 10^{14}$ atoms/cm$^3$ or more, and having a resistivity of 1000 Ω·cm or more.

Before the growth of the nitride semiconductor thin film to be the device layer 16, the intermediate layer 14 may be formed above the silicon single-crystal substrate 12 and the nitride semiconductor thin film to be the device layer 16 may be grown above the intermediate layer 14.

When the trap-rich layer is formed on the surface of the silicon single-crystal substrate 12 (boundary with the intermediate layer 14 in FIG. 1), a forming method thereof is not particularly limited. The trap-rich layer can be formed by ion injection or irradiation of ionizing radiation, such as electron beam, X-ray, and γ-ray.

The device layer 16 composed of the nitride semiconductor thin film is produced by vapor growth, such as a thermal CVD (chemical vapor deposition) method, a MOVPE (metalorganic vapor phase epitaxy) method, an MBE (molecular beam epitaxy) method, a vacuum deposition method, and a sputtering method, above the silicon single-crystal substrate 12 (above the intermediate layer 14 when the intermediate layer 14 is formed above the silicon single-crystal substrate 12). As the device layer, III-V group semiconductors can be used in addition to the nitride semiconductor thin film, such as, for example, GaN, AlN, InN, AlGaN, InGaN, AlInN, and AlScN. The nitride semiconductor thin film can have a thickness of 1 to 10 μm, and can be designed depending on the device.

In the high electron-mobility transistor (HEMT) structure illustrated in FIG. 2, the device layer 16 is desirably a crystal having few crystalline defects and little impurity such as carbon and oxygen for improving device characteristics. Such a crystal can be produced by using a MOVPE method at 900° C. to 1350° C.

Example

Hereinafter, the present invention will be specifically described with Example, but the present invention is not limited thereto.

Example

Three high-resistant low-oxygen CZ silicon substrates produced by the CZ method and having a diameter of 150 mm were prepared. The silicon single-crystal substrates had a resistivity of 1000 $\Omega\cdot$cm or more, an oxygen concentration of $5.0\times10^{16}$ to $2.0\times10^{17}$ atoms/cm$^3$ (JEIDA), and doped nitrogen. The concentration of the doped nitrogen was $1.0\times10^{15}$ atoms/cm$^3$. A nitride semiconductor was epitaxially grown on the prepared high-resistant low-oxygen CZ silicon substrate by using a MOVPE furnace. The growth temperature was 1200° C., and an epitaxial layer having a total thickness of 2.8 μm was grown.

FIG. 3 is a graph indicating a change in a curvature of the nitride semiconductor wafer during the vapor-phase growth. The nitride semiconductor wafer that used the high-resistant low-oxygen CZ silicon substrate with doped nitrogen at $1.0\times10^{19}$ atoms/cm$^3$ caused no plastic deformation during the growth. Warpage after the growth was as small as 30.4 μm on average.

Comparative Example

Three high-resistant low-oxygen CZ silicon substrates that were same as in Example except that no nitrogen was doped were prepared to epitaxially grow a nitride semiconductor in the same manner as in Example.

As indicated in FIG. 3, all the three of the three nitride semiconductor wafers that used the high-resistant low-oxygen CZ silicon substrate without nitrogen doping caused plastic deformation. On the nitride semiconductor wafer that used the high-resistant low-oxygen CZ silicon substrate without nitrogen doping, warpage after the growth was as large as 174.1 μm on average, which was a defect.

From Example and Comparative Example, it has been found that the nitrogen concentration in the silicon single-crystal substrate 12 of $5.0\times10^{14}$ atoms/cm$^3$ or more can yield the effect of the present invention of inhibiting plastic deformation occurrence to reduce substrate warpage.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A nitride semiconductor wafer, comprising:
   a silicon single-crystal substrate; and
   a device layer composed of a nitride semiconductor above the silicon single-crystal substrate,
   wherein the silicon single-crystal substrate is a Czochralski (CZ) silicon single-crystal substrate, and has a resistivity of 1000 $\Omega\cdot$cm or more, an oxygen concentration of $5.0\times10^{16}$ atoms/cm$^3$ JEIDA or more and $2.0\times10^{17}$ atoms/cm$^3$ JEIDA or less, and a nitrogen concentration of $5.0\times10^{14}$ atoms/cm$^3$ or more.

2. The nitride semiconductor wafer according to claim 1, further comprising an intermediate layer composed of a nitride semiconductor or a metal above the silicon single-crystal substrate, wherein the nitride semiconductor wafer has the device layer composed of the nitride semiconductor above the intermediate layer.

3. A method for producing a nitride semiconductor wafer, the method comprising a step of epitaxially growing a nitride semiconductor thin film above a silicon single-crystal substrate, wherein used as the silicon single-crystal substrate is a Czochralski (CZ) silicon single-crystal, having a resistivity of 1000 $\Omega\cdot$cm or more, having an oxygen concentration of $5.0\times10^{16}$ atoms/cm$^3$ (JEIDA) or more and $2.0\times10^{17}$ atoms/cm$^3$ (JEIDA) or less, and having a nitrogen concentration of $5.0\times10^{14}$ atoms/cm$^3$ or more.

4. The method for producing a nitride semiconductor wafer according to claim 3, wherein an intermediate layer composed of a nitride semiconductor or a metal is formed above the silicon single-crystal substrate, and the nitride semiconductor thin film is grown above the intermediate layer.

* * * * *